(12) United States Patent
Okayasu

(10) Patent No.: US 8,058,648 B2
(45) Date of Patent: Nov. 15, 2011

(54) SWITCHING DEVICE AND TESTING APPARATUS

(75) Inventor: Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 55 days.

(21) Appl. No.: 12/442,500

(22) PCT Filed: Aug. 22, 2007

(86) PCT No.: PCT/JP2007/066267
§ 371 (c)(1),
(2), (4) Date: Aug. 20, 2009

(87) PCT Pub. No.: WO2008/035532
PCT Pub. Date: Mar. 27, 2008

(65) Prior Publication Data
US 2009/0302317 A1    Dec. 10, 2009

(30) Foreign Application Priority Data

Sep. 20, 2006    (JP) ................................ 2006-253846

(51) Int. Cl.
*H01L 23/58*    (2006.01)
(52) U.S. Cl. .......... 257/48; 257/316; 257/347; 257/537; 257/E29.3
(58) Field of Classification Search .................... 257/48, 257/316, 347, 537, E29.3
See application file for complete search history.

(56) References Cited

U.S. PATENT DOCUMENTS

2002/0113268 A1*   8/2002  Koyama et al. ............... 257/359
2004/0183159 A1*   9/2004  Tamaki et al. ................ 257/577

FOREIGN PATENT DOCUMENTS

| JP | 63-184367 |   | 7/1988 |
|---|---|---|---|
| JP | 3-208409 |   | 9/1991 |
| JP | 09-237307 | * | 9/1997 |
| JP | 9-237307 |   | 9/1997 |
| JP | 10294488 A |   | 11/1998 |
| JP | 2004-94922 |   | 3/2004 |
| JP | 2004185896 A |   | 7/2004 |

OTHER PUBLICATIONS

International Search Report PCT/JP2007/066267 mailed Nov. 20, 2007 (English & Japanese (4 pages).
Espacenet, Patent Abstract for Japanese Publication No. 2004-185896 Published Jul. 2, 2004 (1 page).
Espacenet, Patent Abstract for Japanese Publication No. 10294488 Published Nov. 4, 1998 (1 page).

* cited by examiner

*Primary Examiner* — Tan N Tran
(74) *Attorney, Agent, or Firm* — Osha Liang LLP

(57) ABSTRACT

There is provided a switching device that electrically connects or disconnects a first terminal and a second terminal to/from each other. The switching device includes a semiconductor layer, a drain electrode that is formed in the semiconductor layer, where the drain electrode is connected to the first terminal, a source electrode that is formed in the semiconductor layer, where the source electrode is connected to the second terminal, a gate insulator that is formed on the semiconductor layer between the drain electrode and the source electrode, a floating gate that is formed on the gate insulator, where the floating gate retains a charge therein, and a tunnel gate that is formed on the floating gate, the tunnel gate supplying a tunnel current determined by a driving voltage applied thereto to charge or discharge the floating gate.

10 Claims, 8 Drawing Sheets

SWITCHING DEVICE AND TESTING APPARATUS

CROSS REFERENCE TO RELATED APPLICATION

This is a continuation application of PCT/JP2007/066267 filed on Aug. 22, 2007 which claims priority from a Japanese Patent Application NO. 2006-253846 filed on Sep. 20, 2006, the contents of which are incorporated herein by reference.

BACKGROUND

1. Technical Field

The present invention relates to a switching device and a testing apparatus. More particularly, the present invention relates to a switching device that connects or disconnects, to/from each other, a drain electrode and a source electrode provided on a semiconductor layer and to a testing apparatus using the same.

2. Related Art

Patent Document 1 discloses a mechanical relay using a reed switch surrounded by a metal guard pipe. The mechanical relay achieves excellent high-frequency characteristics since the guard pipe and the reed switch are arranged coaxially. Patent Document 2 discloses an photo MOSFET relay. The photo MOSFET relay is a semiconductor relay and thus has a longer lifetime than a mechanical relay. Patent Document 3 discloses a semiconductor relay that is turned on/off in such a manner that a high voltage is applied to a control gate to inject electrons into a floating gate and that a gate portion is irradiated with an ultraviolet ray to cause the electrons to be emitted.

A testing apparatus for performing a logic test on a device under test (DUT) includes a pin driver that outputs a test signal to the DUT and a pin comparator that detects an output signal output from the DUT. In order to be capable of performing a direct current (DC) test as well as the logic test, the testing apparatus additionally includes a DC test unit that outputs a DC voltage, a relay (an I/O relay) that connects and disconnects the DUT to/from the pin driver and the pin comparator, and a relay (a DC relay) that connects and disconnects the DC test unit to/from the DUT. The I/O relay and the DC relay are mechanical relays or photo MOSFET relays, for example.

[Patent Document 1] Japanese Patent Application Publication No. 2004-185896

[Patent Document 2] Japanese Patent Application Publication No. 10-294488

[Patent Document 3] Japanese Patent Application Publication No. 03-208409

A mechanical relay provides electrical connection and disconnection by opening and closing of a metal contact. Therefore, the metal contact deteriorates due to friction and the like. Accordingly, the mechanical relay has a short lifetime. Furthermore, the mechanical relay cannot be integrated into a semiconductor integrated circuit, which results in a large size and undermines efforts to increase the device density.

A photo MOSFET relay is configured such that components such as a photocell, a light emitting diode, and a MOSFET are mounted on a lead frame and connected to each other by means of bonding wires. Therefore, the photo MOSFET relay is complex in structure, large and expensive. In addition, the photo MOSFET relay exhibits poor high-frequency characteristics because of the parasitic inductances of the lead frame, bonding wires and the like and the RC product of the on resistance and the gate capacitance of the MOSFET. Furthermore, since the photocell and the light emitting diode are formed by using a GaAs semiconductor or the like, the photo MOSFET relay cannot be integrated together with other circuits that are formed by using a silicon semiconductor. For the reasons stated above, the photo MOSFET relay hampers attempts to reduce the size of a device including the photo MOSFET relay, to increase the density of the device and to lower the cost of the device.

According to the semiconductor relay disclosed in Patent Document 3, it is required to irradiate the gate portion with an ultraviolet ray to cause the electrons to be emitted. The semiconductor relay thus cannot be easily turned on/off.

Here, the testing apparatus outputs a test signal having a high frequency such as several GHz. Accordingly, it is desirable that the I/O relay is capable of transmitting a high-frequency test signal with low distortion and transmitting a test signal whose frequency widely ranges from a DC to approximately several 10 GHz with a low loss. In the testing apparatus, it is desirable that the impedance of the transmission path between the pin driver and the DUT accurately takes a predetermined value (for example, 50Ω). Accordingly, the I/O relay desirably has a small number of impedance mismatch points. Furthermore, the I/O relay desirably has a low DC on resistance so that the loss and waveform distortion can be prevented.

The DC relay is connected at one end thereof to the DUT-side terminal of the I/O relay. Therefore, when the testing apparatus performs a logic test, the electrostatic capacitance of the DC relay during the off state is added to the impedance of the transmission path between the pin driver and the DUT. For this reason, the DC relay desirably has a low electrostatic capacitance during the off state in order to reduce its influence on the impedance of the transmission path for a logic test. Furthermore, the DC relay desirably has a low DC on resistance such that there is no difference in DC level between the output end of the DC test unit and the input end of the DUT.

Here, the testing apparatus repeatedly performs tests, which indicates that the I/O relay and the DC relay are turned on/off a very large number of times. Therefore, the I/O relay and the DC relay desirably have a long lifetime.

In light of the above, a switch that is utilized as the I/O relay in the testing apparatus desirably has excellent high-frequency transmission characteristics, a wide frequency range and a low loss, a small number of impedance mismatch points, and a low DC on resistance. On the other hand, a switch that is utilized as the DC relay in the testing apparatus desirably has a low electrostatic capacitance during the off state and a low DC on resistance. Furthermore, the switches that are utilized as the I/O relay and the DC relay in the testing apparatus desirably have a long lifetime. Here, the mechanical relay and the photo MOSFET relay discussed above both have advantages and disadvantages for their usage as the I/O relay and the DC relay in the testing apparatus.

SUMMARY

Therefore, it is an object of an aspect of the innovations herein to provide a switching device and a testing apparatus which are capable of overcoming the above drawbacks accompanying the related art. The above and other objects can be achieved by combinations described in the independent claims. The dependent claims define further advantageous and exemplary combinations of the innovations herein.

According to the first aspect related to the innovations herein, one exemplary switching device may electrically connect or disconnect a first terminal and a second terminal to/from each other. The switching device includes a semiconductor layer, a drain electrode that is formed in the semiconductor layer, where the drain electrode is connected to the first terminal, a source electrode that is formed in the semiconductor layer, where the source electrode is connected to the second terminal, a gate insulator that is formed on the semiconductor layer between the drain electrode and the source electrode, a floating gate that is formed on the gate insulator, where the floating gate retains a charge therein, and a tunnel gate that is formed on the floating gate, where the tunnel gate supplies a tunnel current determined by a driving voltage applied thereto to charge or discharge the floating gate.

According to the second aspect related to the innovations herein, one exemplary testing apparatus may test a device under test. The testing apparatus includes a test signal generating section that generates a test signal, a driver that supplies the test signal to the device under test, a comparator that detects an output signal from the device under test, a judging section that judges the output signal detected by the comparator, and a switching device that electrically connects or disconnects, to/from each other, a first terminal and a second terminal, which are respectively (i) at least one of an output end of the driver and an input end of the comparator and (ii) an input and output end of the device under test. Here, the switching device includes a semiconductor layer, a drain electrode that is formed in the semiconductor layer, where the drain electrode is connected to the first terminal, a source electrode that is formed in the semiconductor layer, where the source electrode is connected to the second terminal, a gate insulator that is formed on the semiconductor layer between the drain electrode and the source electrode, a floating gate that is formed on the gate insulator, the floating gate retaining a charge therein, and a tunnel gate that is formed on the floating gate, where the tunnel gate supplies a tunnel current determined by a driving voltage applied thereto to charge or discharge the floating gate.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

Figure 1:
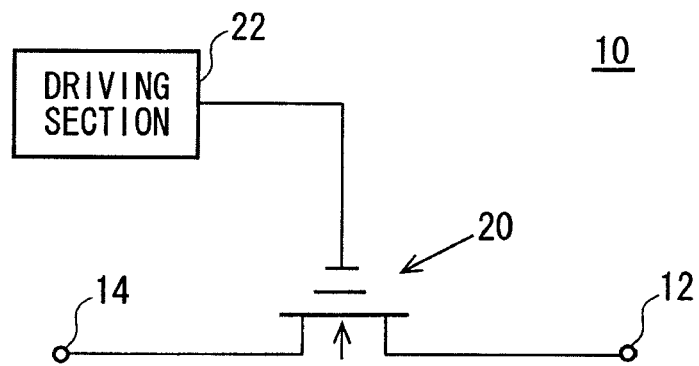
FIG. 1 illustrates the configuration of a switching device 10 relating to an embodiment of the present invention.

FIG. 1 illustrates the configuration of a switching device 10 relating to an embodiment of the present invention. The switching device 10 includes a semiconductor switch 20 and a driving section 22. The switching device 10 electrically connects or disconnects a first terminal 12 and a second terminal 14 to/from each other. The semiconductor switch 20 is formed on a semiconductor, and electrically connects or disconnects its drain and its source to/from each other (i.e., turned on or off) depending on a driving voltage supplied to its gate. The semiconductor switch 20 may be of an n-channel type whose majority carrier of the current flowing between the drain and the source is electrons or a p-channel type whose majority carrier is holes. The driving section 22 applies a driving voltage to the gate of the semiconductor switch 20 in order to electrically connect or disconnect the drain and the source to/from each other.

Figure 2:
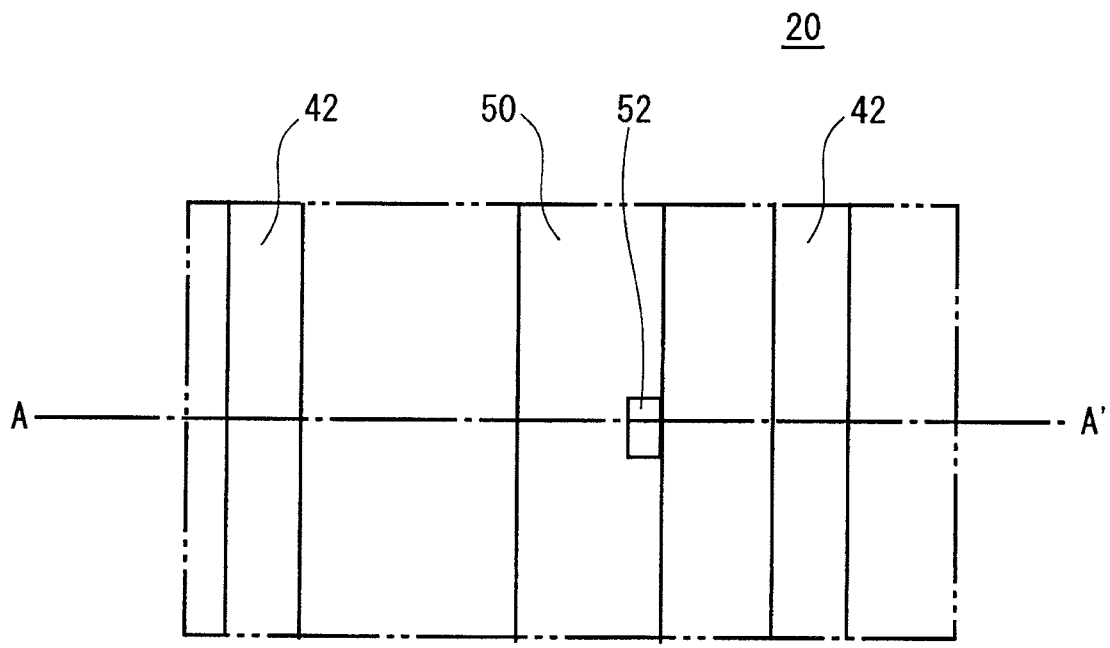
FIG. 2 is an exemplary top view illustrating the configuration of a semiconductor switch 20 relating to the embodiment.
Figure 3:
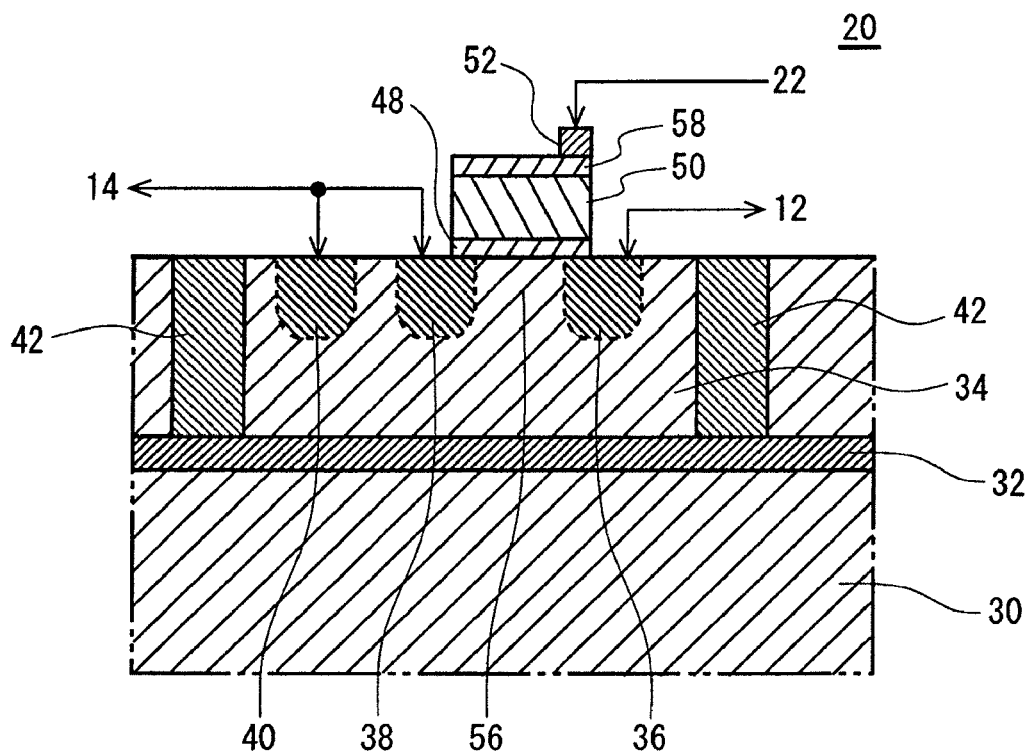
FIG. 3 is a cross-sectional view illustrating the semiconductor switch 20 relating to the embodiment along a line A-A' shown in FIG. 2.

FIG. 2 is an exemplary top view illustrating the configuration of the semiconductor switch 20 relating to the embodiment. FIG. 3 is a cross-sectional view illustrating the semiconductor switch 20 relating to the embodiment along a line A-A' shown in FIG. 2. The semiconductor switch 20 includes a semiconductor substrate 30, an insulating layer 32, a semiconductor layer 34, a drain electrode 36, a source electrode 38, a substrate contact electrode 40, an inter-channel insulating portion 42, a gate insulator 48, a floating gate 50, and a tunnel gate 52.

The semiconductor substrate 30 may be formed from single-crystal silicon, for example. The insulating layer 32 is formed on the semiconductor substrate 30, and insulates the upper layer, i.e., the semiconductor layer 34 and the lower layer, i.e., the semiconductor substrate 30 from each other. The insulating layer 32 may be a silicon dioxide film, for example.

The semiconductor layer 34 is disposed on the insulating layer 32. The semiconductor layer 34 may be formed by implanting n- or p-type impurities into a semiconductor such as silicon. For example, the semiconductor layer 34 may be a p-type semiconductor region when the semiconductor switch 20 is an n-channel switch and may be an n-type semiconductor region when the semiconductor switch 20 is a p-channel switch.

The drain electrode 36 is formed as a partial region within the semiconductor layer 34. For example, the drain electrode 36 may be an n-type semiconductor region when the semiconductor switch 20 is a n-channel switch and may be a p-type semiconductor region when the semiconductor switch 20 is a p-channel switch. The drain electrode 36 is connected to the first terminal 12 through interconnections.

The source electrode 38 is formed as a partial region within the semiconductor layer 34 and positioned away by a predetermined distance from the drain electrode 36 when the semiconductor switch 20 is seen from above. For example, the source electrode 38 may be an n-type semiconductor region when the semiconductor switch 20 is an n-channel switch and may be a p-type semiconductor region when the semiconductor switch 20 is a p-channel switch. The source electrode 38 is connected to the second terminal 14 through interconnections. Here, the region in the semiconductor layer 34 between the drain electrode 36 and the source electrode 38 constitutes a channel 56 for the carrier between the drain and the source.

The substrate contact electrode 40 is formed as a partial region within the semiconductor layer 34, which is different from the regions of the drain electrode 36 and the source electrode 38 when the semiconductor switch 20 is seen from above. For example, the substrate contact electrode 40 may be a p-type semiconductor region when the semiconductor switch 20 is an n-channel switch and may be an n-type semiconductor region when the semiconductor switch 20 is a p-channel switch. For example, the source electrode 38 may be connected to the second terminal 14 through interconnections.

The inter-channel insulating portion 42 is formed within the semiconductor layer 34 and insulates a region at least including the drain electrode 36, the source electrode 38, the substrate contact electrode 40, and the channel 56 positioned between the drain electrode 36 and the source electrode 38, from a different region. For example, the inter-channel insulating portion 42 may be formed so as to surround the drain electrode 36, the source electrode 38, the substrate contact electrode 40 and the channel 56 when the semiconductor switch 20 is seen from above. For example, the inter-channel insulating portion 42 may extend through the semiconductor layer 34 from the upper surface of the semiconductor layer 34 to the insulating layer 32 when the semiconductor switch 20 is seen in cross-section.

The semiconductor switch 20 having the above-described configuration forms a Silicon-on-Insulator (SOI) device due to the insulating layer 32. In the semiconductor switch 20, the inter-channel insulating portion 42 formed on the insulating layer 32 may electrically insulates the region at least including the drain electrode 36, the source electrode 38, the substrate contact electrode 40, and the channel 56 positioned between the drain electrode 36 and the source electrode 38, from a different region.

Because of the above-described insulator arrangement, the semiconductor switch 20 is electrically coupled to the outside via the insulating layer 32 and the inter-channel insulating portion 42 by means of a significantly low electrostatic capacitance. Thus, the semiconductor switch 20 can significantly reduce the electrostatic capacitance coupling between the substrate and the drain and source regions and the electrostatic capacitance coupling between the channel and the substrate. As a result, when used as a switch, the semiconductor switch 20 can achieve significantly small electrostatic capacitance coupling between the signal transmission path and a different region, thereby improving both the high-frequency transmission characteristics and the electrostatic capacitance during the off state. Here, the semiconductor switch 20 may not necessarily form an SOI device. Furthermore, the inter-channel insulating portion 42 may not be required to be formed on the insulating layer 32 in the semiconductor switch 20.

The gate insulator 48 is formed on the semiconductor layer 34 at least between the drain electrode 36 and the source electrode 38. In other words, the gate insulator 48 is formed on the channel 56. For example, the gate insulator 48 may be a thin film formed from silicon dioxide. The floating gate 50 is formed on the gate insulator 48, and retains therein charges when the charges are injected. For example, the floating gate 50 may be a polysilicon member surrounded by a floating gate insulating portion 58 formed by a silicon oxide film. With such a configuration, the floating gate 50 can prevent electrons from being emitted outside and retain the electrons therein.

The tunnel gate 52 is formed on the floating gate 50, and is supplied with the driving voltage output from the driving section 22. The tunnel gate 52 provides a tunnel current determined by the supplied driving voltage in order to charge or discharge the floating gate 50. For example, the tunnel gate 52 may be formed on a portion, of the insulator on the upper surface of the floating gate 50, whose thickness is reduced to such a degree that the tunnel current can flow.

For example, the area of the tunnel gate 52 on the floating gate 50 may be smaller than the area of the floating gate 50 on the channel 56. As another example, the area of the tunnel gate 52 on the floating gate 50 may be substantially the same as the area of the floating gate 50 on the channel 56. As yet another example, when the tunnel gate 52 is formed on and shared by a plurality of floating gates 50 and a common driving voltage is supplied, the area of the tunnel gate 52 on the floating gates 50 may be larger than the area of each floating gate 50 on the channel 56.

The switching device 10 having the above-described configuration operates as described below when the semiconductor switch 20 is of an n-channel type. To begin with, with the floating gate 50 being in the uncharged state, the driving section 22 applies a driving voltage having a predetermined polarity to the tunnel gate 52 so that a tunnel current flows in such a direction that charges are injected into the floating gate 50. In this way, the floating gate 50 is charged. For example, the driving section 22 may apply to the tunnel gate 52 a voltage of approximately 10 to 20 volts relative to the potential of the source electrode 38 to provide the tunnel current in such a direction that charges are injected into the floating gate 50. After the charging is completed, i.e., after a predetermined amount of charges have been injected into the floating gate 50, the driving section 22 may stop applying the driving voltage. After this, the floating gate 50 can retain the injected charges therein without requiring the driving voltage being applied.

While the floating gate 50 is charged, an inversion layer is formed at the interface between the channel 56 and the gate insulator 48. Accordingly, while the floating gate 50 is charged, the semiconductor switch 20 allows currents to flow between the drain and the source. In other words, while the floating gate 50 is charged, the semiconductor switch 20 electrically connects the drain electrode 36 and the source electrode 38 to each other (i.e., the semiconductor switch 20 is turned on).

Subsequently, with the floating gate 50 being in the charged state, the driving section 22 applies to the tunnel gate 52 a driving voltage having a predetermined polarity so that a tunnel current flows in such a direction that the charges are emitted from the floating gate 50. In this manner, the floating gate 50 is discharged. For example, the driving section 22 may apply to the tunnel gate 52 a voltage whose polarity is opposite to the polarity of the voltage applied to charge the floating gate 50 in order to cause the tunnel current to flow in such a direction that the charges are emitted from the floating gate 50. As an example, the driving section 22 may apply to the tunnel gate 52 a voltage of approximately −10 to −20 volts relative to the potential of the source electrode 38 to provide the tunnel current in such a direction that the charges are emitted from the floating gate 50. After the discharging is completed, i.e., after the amount of charges in the floating gate 50 has been reduced to zero or a significantly low level, the driving section 22 may stop applying the driving voltage.

After this, the floating gate 50 can retain the zero or significantly low charge level without requiring the driving voltage being applied.

While the floating gate 50 is uncharged, no inversion layer is formed at the interface between the channel 56 and the gate insulator 48. Accordingly, while the floating gate 50 is uncharged, the semiconductor switch 20 allows no currents to flow between the drain and the source. In other words, while the floating gate 50 is uncharged, the semiconductor switch 20 electrically disconnects the drain electrode 36 and the source electrode 38 from each other (i.e., the semiconductor switch 20 is turned off).

On the other hand, the switching device 10 operates as described below when the semiconductor switch 20 is of a p-channel type. When compared with the case where the semiconductor switch 20 is of an n-channel type, the charges are injected into and emitted from the floating gate 50 with the polarity of the driving voltage being reversed.

While the floating gate 50 is charged with a negative potential relative to the potential of the source, an inversion layer is formed at the interface between the channel 56 and the gate insulator 48. Accordingly, while the floating gate 50 is charged with a negative potential, the semiconductor switch 20 allows currents to flow between the drain and the source. In other words, while the floating gate 50 is charged, the semiconductor switch 20 electrically connects the drain electrode 36 and the source electrode 38 to each other (i.e., the semiconductor switch 20 is turned on).

While the floating gate 50 is not charged with a negative potential, no inversion layer is formed at the interface between the channel 56 and the gate insulator 48. Accordingly, while the floating gate 50 is not charged with a negative potential, the semiconductor switch 20 allows no currents to flow between the drain and the source. In other words, while the floating gate 50 is uncharged, the semiconductor switch 20 electrically disconnects the drain electrode 36 and the source electrode 38 from each other (i.e., the semiconductor switch 20 is turned off).

As described above, the driving section 22 controls the driving voltage to be applied to the tunnel gate 52 to cause the tunnel gate 52 to charge or discharge the floating gate 50, thereby electrically connecting or disconnecting the drain electrode 36 and the source electrode 38 to/from each other. In this manner, the semiconductor switch 20 can electrically connects or disconnects the first terminal 12 and the second terminal 14 to/from each other.

In the switching device 10 described above, since the capacitance component of the floating gate 50 is connected in series to the capacitance component of the tunnel gate 52, there is a very low gate coupling capacitance (C) between (i) the driving section 22 and (ii) the drain electrode 36, the channel 56 and the source electrode 38. Therefore, the switching device 10 can decrease the product of the gate coupling capacitance (C) and the on resistance (R) between the drain electrode 36 and the source electrode 38 (RC product), thereby enhancing the transmission characteristics of high-frequency signals. Furthermore, the switching device 10 can accomplish a further lower gate coupling capacitance (C) since the size of the tunnel gate 52 can be made smaller as long as the tunnel current can at least flow, thereby further improving the transmission characteristics of high-frequency signals.

Being formed from a semiconductor, the switching device 10 has a longer lifetime and is more reliable than a mechanical relay. Moreover, the switching device 10 can be turned on/off by means of a voltage, which makes it easy to control the switching device 10. The switching device 10 has a smaller number of constituents than an photo MOSFET relay and can be integrated into a silicon semiconductor integrated circuit. Therefore, the switching device 10 has a simplified configuration, can contribute to efforts of decreasing the size of devices utilizing the switching device 10, and can lower the manufacturing cost.

Figure 4:
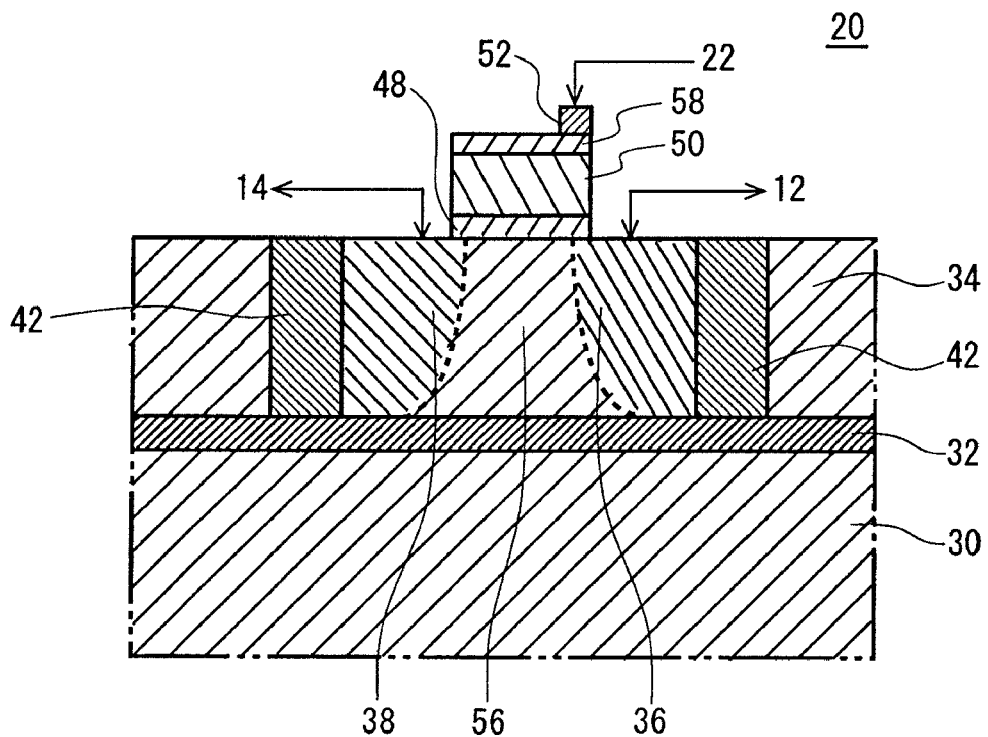
FIG. 4 is a cross-sectional view illustrating a first modification example of the semiconductor switch 20 relating to the embodiment.

FIG. 4 is a cross-sectional view illustrating a first modification example of the semiconductor switch 20 relating to the embodiment. The constituents of the switching device 10 relating to the first modification example have substantially the same configurations and functions as the corresponding constituents assigned with the same reference numerals in FIGS. 1 to 3. Therefore, the following description only mentions the difference between the first modification example and the above embodiment.

In the semiconductor switch 20 relating to the first modification example, the regions constituting the drain electrode 36 and the source electrode 38 extend from the surface of the semiconductor layer 34 to the boundary between the semiconductor layer 34 and the insulating layer 32. Furthermore, the semiconductor switch 20 relating to the first modification example does not include the substrate contact electrode 40. In other words, the semiconductor switch 20 forms a fully depleted SOI device. The semiconductor switch 20 having such a configuration can further decrease the electrostatic capacitance between (i) the semiconductor substrate 30 and (ii) the drain electrode 36, the channel 56 and the source electrode 38.

Figure 5:
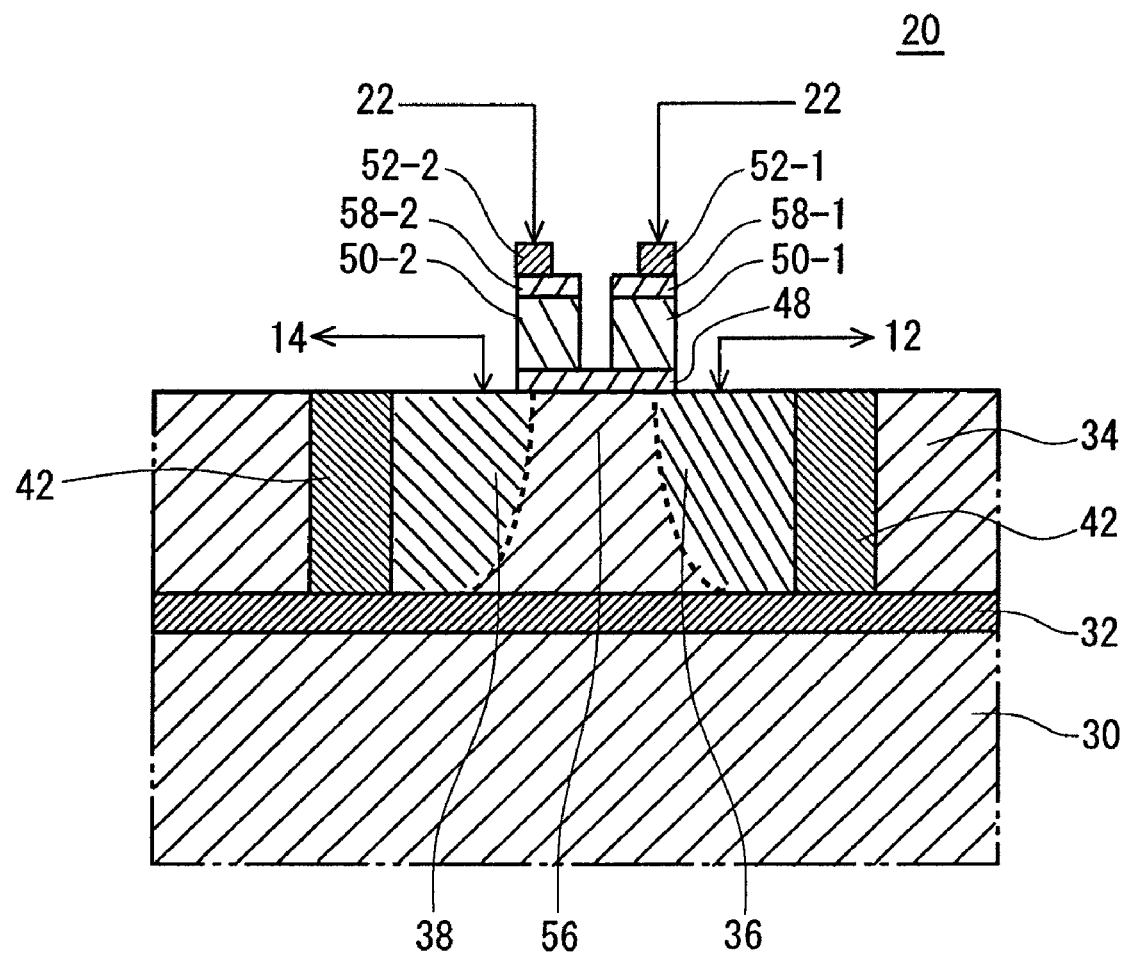
FIG. 5 is a cross-sectional view illustrating a second modification example of the semiconductor switch 20 relating to the embodiment.

FIG. 5 is a cross-sectional view illustrating a second modification example of the semiconductor switch 20 relating to the embodiment. The constituents of the switching device 10 relating to the second modification example have substantially the same configurations and functions as the corresponding constituents assigned with the same reference numerals in FIG. 4. Therefore, the following description only mentions the difference between the first and second modification examples.

The semiconductor switch 20 relating to the second modification example includes a first floating gate 50-1, a second floating gate 50-2, a first tunnel gate 52-1, and a second tunnel gate 52-2. The first floating gate 50-1 is disposed on a region on the gate insulator 48 which is closer to the drain electrode 36 than to the source electrode 38. The second floating gate 50-2 is disposed on a region on the gate insulator 48 in which the first floating gate 50-1 is not disposed and which is spaced away by a predetermined gap from the region on which the first floating gate 50-1 is disposed. In other words, the second floating gate 50-2 is disposed on a region on the gate insulator 48 which is closer to the source electrode 38 than to the drain electrode 36, and is positioned away form the first floating gate 50-1 by a predetermined distance.

The first tunnel gate 52-1 is disposed on the first floating gate 50-1. The second tunnel gate 52-2 is disposed on the second floating gate 50-2. As discussed above, the floating gate 50 and the tunnel gate 52 are respectively divided into two portions between the drain and the source in the semiconductor switch 20. The switching device 10 having the above-described configuration can further decrease the electrostatic capacitance between the drain electrode 36 and the source electrode 38 during the off state.

Figure 6:
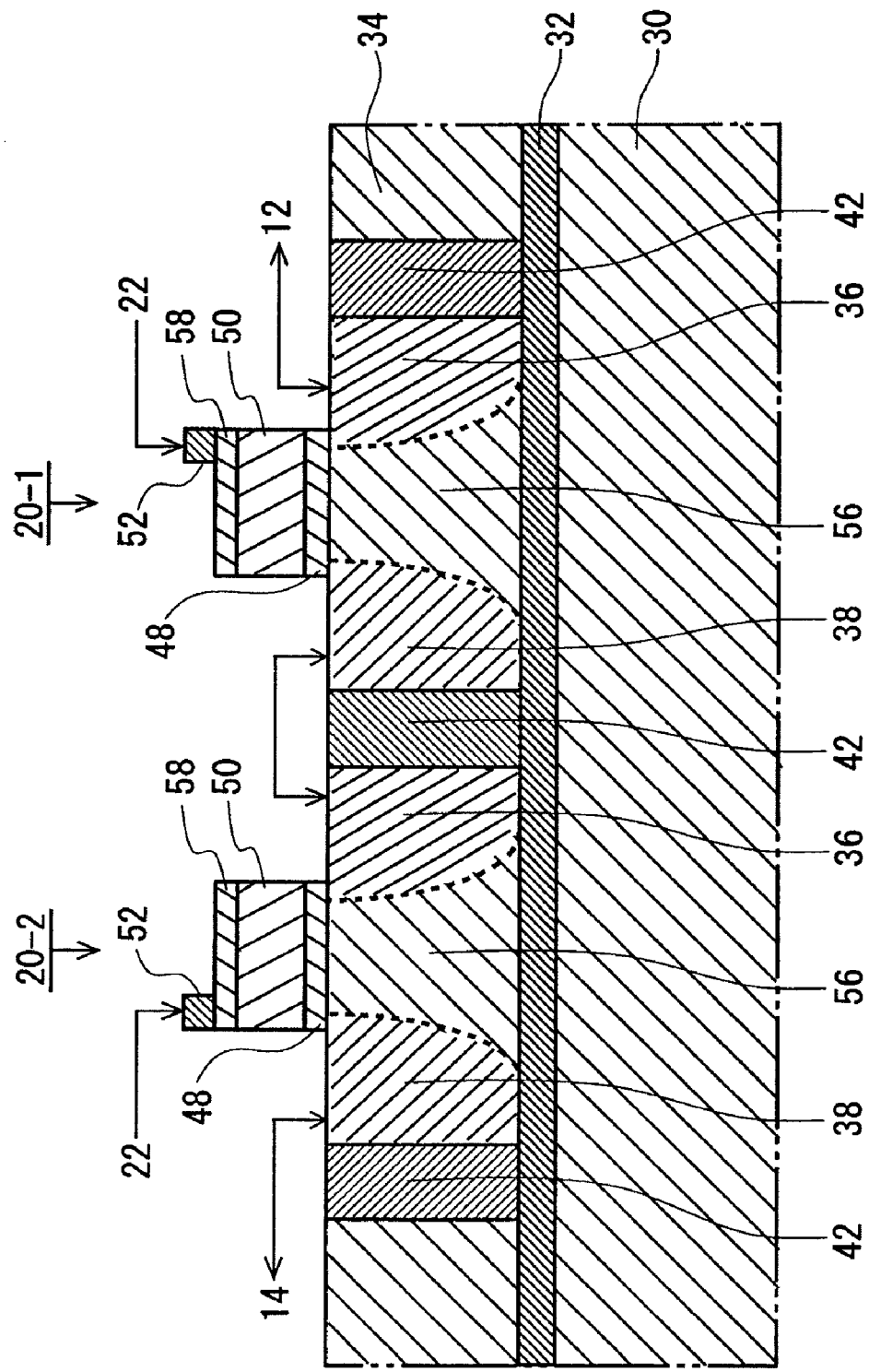
FIG. 6 is a cross-sectional view illustrating a first semiconductor switch 20-1 and a second semiconductor switch 20-2 relating to a third modification example of the embodiment.

FIG. 6 is a cross-sectional view illustrating a first semiconductor switch 20-1 and a second semiconductor switch 20-2 relating to a third modification example of the embodiment. The constituents of the switching device 10 relating to the third modification example have substantially the same configurations and functions as the corresponding constituents assigned with the same reference numerals in FIG. 4. Therefore, the following description only mentions the difference between the first and third modification examples.

The switching device 10 relating to the third modification example includes a first semiconductor switch 20-1 and a second semiconductor switch 20-2. The drain electrode 36 of the first semiconductor switch 20-1 is connected to the first terminal 12 through interconnections. The source electrode 38 of the second semiconductor switch 20-2 is connected to the second terminal 14 through interconnections. The source electrode 38 of the first semiconductor switch 20-1 is connected to the drain electrode 36 of the second semiconductor switch 20-2 through interconnections. Since the two semiconductor switches 20 are connected in cascade, the switching device 10 having the above-described configuration can further reduce the electrostatic capacitance between the first terminal 12 and the second terminal 14 during the off state.

Figure 7:
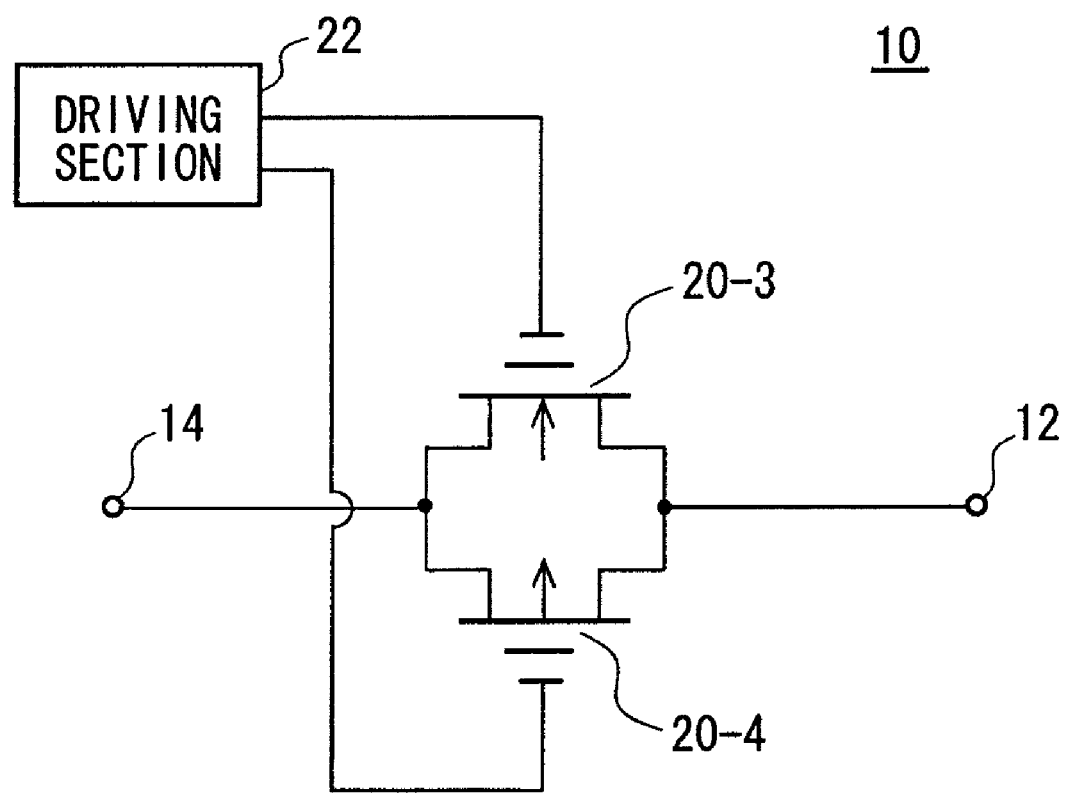
FIG. 7 illustrates the configuration of a fourth modification example of the switching device 10 relating to the embodiment.

FIG. 7 illustrates the configuration of a fourth modification example of the switching device 10 relating to the embodiment. The constituents of the switching device 10 relating to the fourth modification example have substantially the same configurations and functions as the corresponding constituents assigned with the same reference numbers shown in FIG. 1. Therefore, the following description only mentions the difference between the fourth modification example and the embodiment.

The switching device 10 relating to the fourth modification example includes a third semiconductor switch 20-3 that is of an n-channel type and a fourth semiconductor switch 20-4 that is of a p-channel type. The third and fourth semiconductor switches 20-3 and 20-4 shown in FIG. 7 have the same configurations and functions as the semiconductor switch 20 shown in FIGS. 1 to 3. Therefore, the following description only mentions the difference between the fourth modification example and the embodiment. The n-channel third semiconductor switch 20-3 and the p-channel fourth semiconductor switch 20-4 are each connected at the drain electrode 36 thereof to the first terminal 12 and at the source electrode 38 thereof to the second terminal 14.

The driving section 22 applies driving voltages with different polarities to the tunnel gate 52 of the third semiconductor switch 20-3 and the tunnel gate 52 of the fourth semiconductor switch 20-4 in such a manner that one of the third and fourth semiconductor switches 20-3 and 20-4 is charged while the other is discharged. According to such a configuration, when one of the third and fourth semiconductor switches 20-3 and 20-4 is turned on, the other is also turned on. Similarly, when one of the third and fourth semiconductor switches 20-3 and 20-4 is turned off, the other is also turned off. In other words, the third and fourth semiconductor switches 20-3 and 20-4 can be both turned on or off. The switching device 10 relating to the fourth modification example can improve the DC transmission characteristics during the on state and reduce the transmission distortion during the on state.

Figure 8:
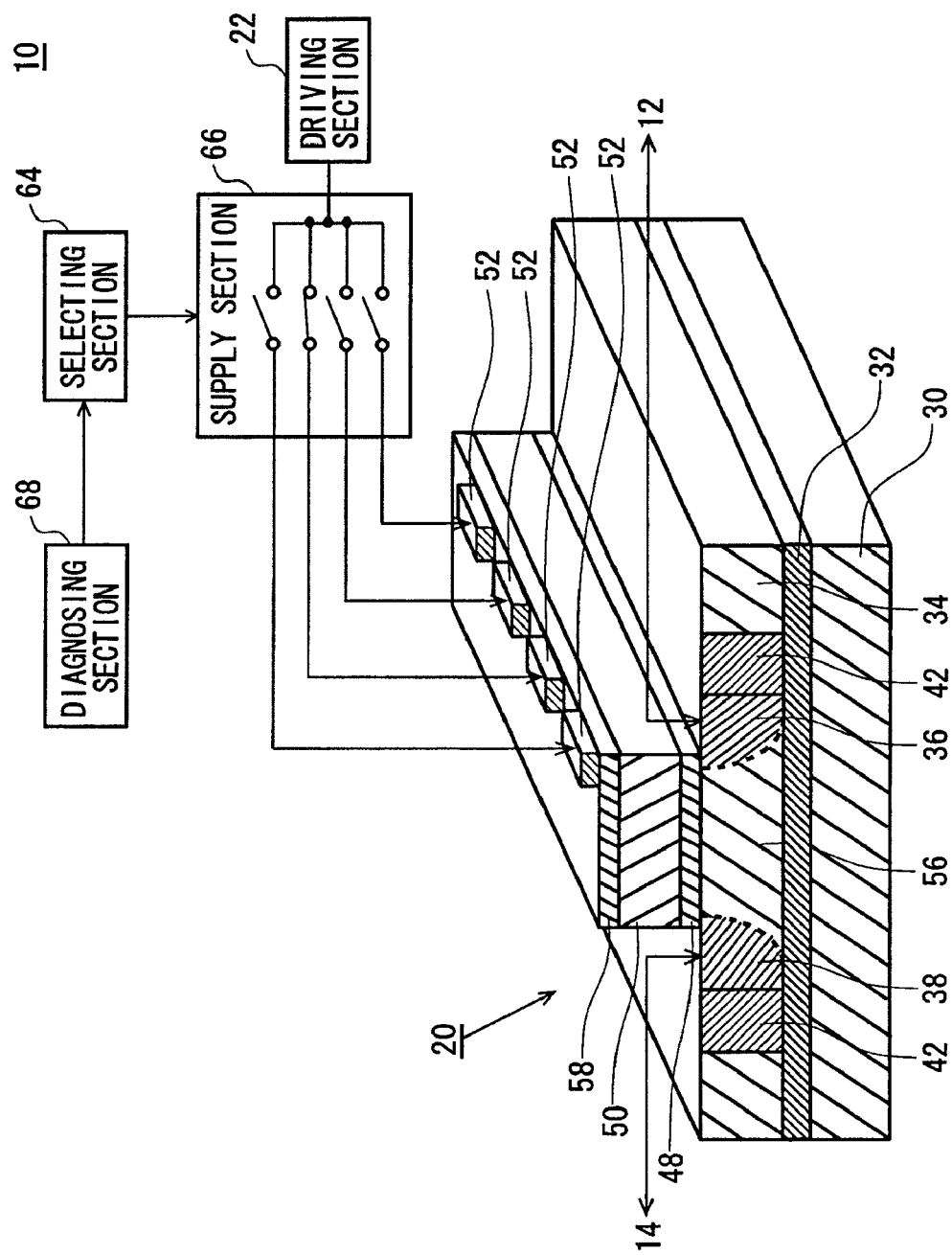
FIG. 8 illustrates the configuration of a fifth modification example of the switching device 10 relating to the embodiment.

FIG. 8 illustrates the configuration of a fifth modification example of the switching device 10 relating to the embodiment. The constituents of the switching device 10 relating to the fifth modification example have substantially the same configurations and functions as the corresponding constituents assigned with the same reference numerals in FIGS. 1 to 3. Therefore, the following description only mentions the difference between the fifth modification example and the embodiment.

According to the fifth modification example, the semiconductor switch 20 includes a plurality of tunnel gates 52 formed in different regions on the floating gate 50. Furthermore, the switching device 10 relating to the fifth modification example additionally includes a selecting section 64 and a supply section 66. The selecting section 64 selects at least one of the tunnel gates 52. For example, the selecting section 64 may select one of the tunnel gates 52 or more than one of the tunnel gates 52.

The supply section 66 supplies the driving voltage output from the driving section 22 to the tunnel gate 52 selected by the selecting section 64. For example, the supply section 66 may switch the driving voltage destination among the tunnel gates 52 by means of a switch that turns on the connecting path that supplies the driving voltage to the selected tunnel gate 52 and turns off the connecting paths that supply the driving voltage to the other tunnel gates 52.

The above-mentioned switch may turn on/off the connecting paths between the driving section 22 and the tunnel gates 52 by means of a plurality of pass transistors. The pass transistors may be smaller in size than the semiconductor switch 20. For example, the pass transistors may be approximately a hundredth of the semiconductor switch 20 in size. According to such a configuration, all of the pass transistors are turned off except for the pass transistor to supply the driving voltage to the selected tunnel gate 52. Therefore, the provision of the pass transistors newly adds only a low capacitance to the gate coupling capacitance (C) of the semiconductor switch 20. According to the switching device 10 having the above-described configuration, when one of the tunnel gates 52 deteriorates and cannot provide a sufficient tunnel current, one of the remaining tunnel gates 52 that have not deteriorated can be alternatively selected. In such a manner, the fifth modification example can increase the lifetime and reliability.

The switching device 10 relating to the fifth modification example may further include a diagnosing section 68. The diagnosing section 68 diagnoses the characteristics of the connection and disconnection between the first terminal 12 and the second terminal 14 observed when each tunnel gate 52 is selected. For example, the diagnosing section 68 may detect the characteristics of the connection and the disconnection between the first terminal 12 and the second terminal 14 and diagnose whether each tunnel gate 52 can be used based on the detection result. For example, the diagnosing section 68 may detect the on resistance and the off resistance between the first terminal 12 and the second terminal 14 observed when each tunnel gate 52 is selected, and diagnose that the associated tunnel gate 52 can be used when the detected on resistance is no greater than a predetermined first threshold value and the detected off resistance is no lower than a predetermined second threshold value. For example, the diagnosing section 68 may directly detect and measure the on resistance and the off resistance between the first terminal 12 and the second terminal 14. As an alternative example, the diagnosing section 68 may supply a signal to the switching device 10 with the use of a driver circuit or a DC test unit and measure the characteristics of the output signal.

When the switching device 10 includes the diagnosing section 68, the selecting section 64 may select one of the tunnel gates 52 depending on the diagnosis made by the diagnosing section 68. For example, the selecting section 64 may select one of the tunnel gates 52 which is diagnosed usable. In this way, the switching device 10 can eliminate one or more defective tunnel gates 52 and select one or more usable tunnel gates 52.

Alternatively to the above-described diagnosing procedure, the diagnosing section 68 may diagnose the characteristics of the connection and the disconnection between the first terminal 12 and the second terminal 14 observed when a first tunnel gate 52 is selected. For example, the diagnosing section 68 may diagnose the characteristics of the connection and the disconnection between the first terminal 12 and the second terminal 14 observed when a first tunnel gate 52 that is used in an immediately preceding test is selected. The selecting section 64 may select a second tunnel gate 52 when the diagnosis of the characteristics observed when the first tunnel gate 52 is selected indicates a defective result. For example, the selecting section 64 may select a second tunnel gate 52 that has not been used in past tests. With such a configuration, the switching device 10 can sequentially select a next new tunnel gate 52 when the characteristics of a particular tunnel gate 52 age over time.

Figure 9:
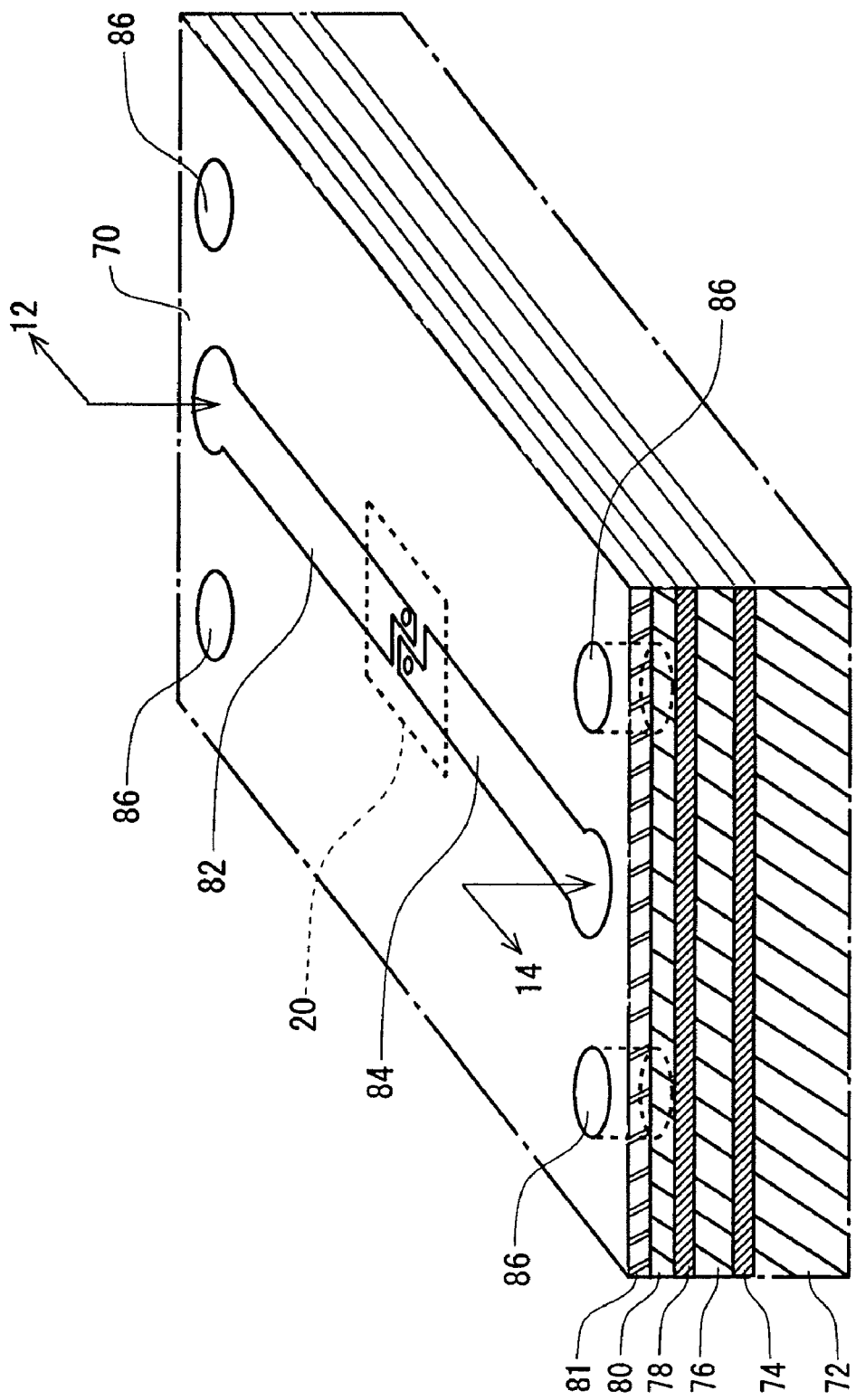
FIG. 9 illustrates the configuration of a microstrip substrate 70 relating to a sixth modification example of the embodiment.

FIG. 9 illustrates the configuration of a sixth modification example of the semiconductor switch 20 relating to the embodiment. The constituents of the switching device 10 relating to the sixth modification example have substantially the same configurations and functions as the corresponding constituents assigned with the same reference numerals shown in FIGS. 1 to 3. Therefore, the following description only mentions the difference between the sixth modification example and the embodiment.

The switching device 10 relating to the sixth modification example may additionally include a microstrip substrate 70. The microstrip substrate 70 includes a first semiconductor layer 72, a first insulating layer 74, a second semiconductor layer 76, a ground layer 78, an inter-layer insulator 80, an interconnection layer 81 in which a first transmission line 82 and a second transmission line 84 are formed, and vias 86.

For example, the first semiconductor layer 72 may be a silicon substrate. The first insulating layer 74 is disposed on the first semiconductor layer 72, and insulates the upper layer, i.e., the second semiconductor layer 76 from the lower layer, i.e., the first semiconductor layer 72. The second semiconductor layer 76 is disposed on the first insulating layer 74. The second semiconductor layer 76 may be a silicon film, for example.

The ground layer 78 is disposed on the second semiconductor layer 76. The ground layer 78 is formed from an electrically conductive material, and connected to the ground. The inter-layer insulator 80 is disposed on the ground layer 78, and insulates the upper layer, i.e., the interconnection layer 81 from the lower layer, i.e., the ground layer 78. The interconnection layer 81 has interconnections formed therein. The interconnection layer 81 may be formed by a plurality of layers. When the interconnection layer 81 is formed by a plurality of interconnection layers 81, the microstrip substrate 70 may include an inter-layer insulator 80 between adjacent interconnection layers 81 to insulate the upper interconnection layer 81 from the lower interconnection layer 81. Here, at least one of the interconnection layers 81 includes the first and second transmission lines 82 and 84.

The first and second transmission lines 82 and 84 are metal interconnections or the like formed on the inter-layer insulator 80 that transmit signals. The first and second transmission lines 82 and 84 form a microstrip relative to the ground layer 78. Therefore, the first and second transmission lines 82 and 84 can transmit high frequency signals. Alternatively, the ground layer 78 may be formed in the interconnection layer 81. Furthermore, the first semiconductor layer 76 may have interconnections formed therein.

The first transmission line 82 is connected at one end thereof to the first terminal 12 and at the other end thereof to one of the drain electrode 36 and the source electrode 38 of the semiconductor switch 20 formed on the microstrip substrate 70. The second transmission line 84 is connected at one end thereof to the second terminal 14 and at the other end thereof to the other of the source electrode 38 and the drain electrode 36 of the semiconductor switch 20 formed on the microstrip substrate 70, which is not connected to the second transmission line 84. Note that the first and second transmission lines 82 and 84 may be connected to the first and second terminal 12 and 14 that are disposed on a different substrate, through pads formed on the surface of the microstrip substrate 70. Alternatively, the first and second transmission lines 82 and 84 may be connected to the first and second terminals 12 and 14 that are provided in a different integrated circuit within the microstrip substrate 70.

The vias 86 extend through the inter-layer insulator 80 and the interconnection layer 81, and electrically connect the ground layer 78 to the ground pads formed on the surface of the microstrip substrate 70. For example, the ground pads may be provided to mount the microstrip substrate 70 to a different substrate by means of, for example, flip-chip bonding.

The above-described switching device 10 relating to the sixth modification example can reduce interconnections such as lead frames and bonding wires. Therefore, the switching device 10 can decrease the floating inductance and capacitance and further reduce the number of impedance mismatching points. Note that the first and second transmission lines 82 and 84 may be coplanar lines or differently structured transmission lines formed on a semiconductor substrate, instead of being microstrips.

Figure 10:
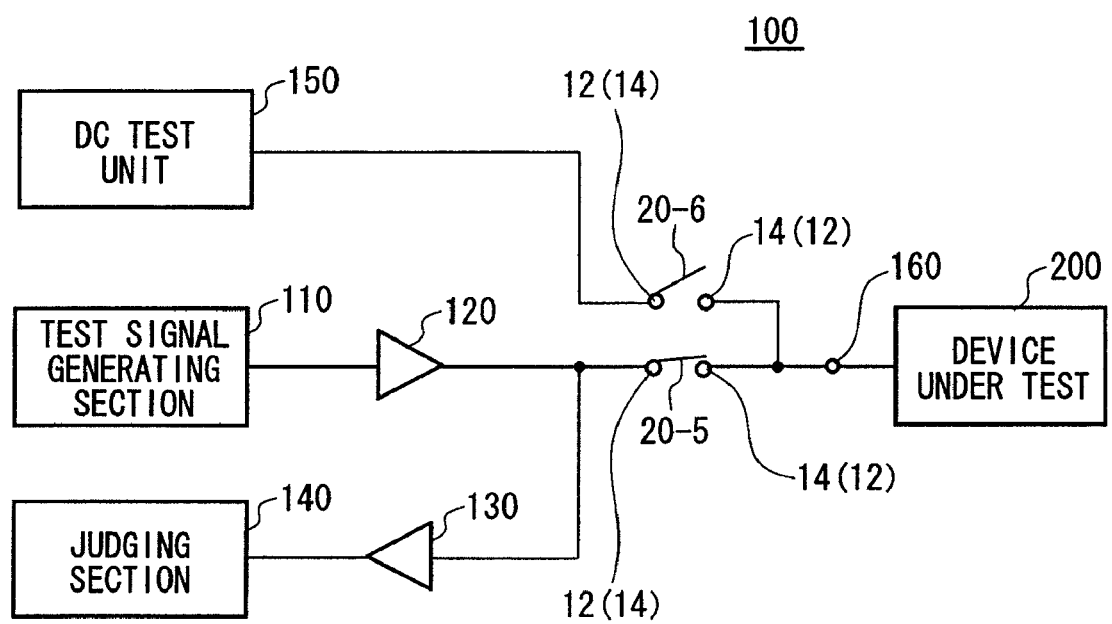
FIG. 10 illustrates the configuration of a testing apparatus 100 relating to an embodiment of the present invention.

FIG. 10 illustrates the configuration of a testing apparatus 100 relating to an embodiment of the present invention. The testing apparatus 100 tests a device under test 200. For example, the testing apparatus 100 conducts a logic test and a DC test on the device under test 200. The testing apparatus 100 includes a test signal generating section 110, a driver 120, a comparator 130, a judging section 140, a DC test unit 150, a fifth semiconductor switch 20-5, and a sixth semiconductor switch 20-6. Here, the fifth and sixth semiconductor switches 20-5 and 20-6 shown in FIG. 10 have the same configurations and functions as the semiconductor switch 20 shown in FIGS. 1 to 3. Therefore, the following description only mentions the difference between the present embodiment and the previously discussed embodiment.

The test signal generating section 110 generates a test signal to be input into the device under test 200. For example, the test signal generating section 110 may include a pattern generator and a waveform shaper. The pattern generator generates a test pattern designating the waveform of the test signal. The waveform shaper generates the test signal in accordance with the test pattern output from the pattern generator.

The driver 120 supplies the test signal generated by the test signal generating section 110 to the device under test 200 via an input/output (I/O) terminal 160. The comparator 130 is connected at the input end thereof to the output end of the driver 120, receives the output signal from the device under test 200 via the I/O terminal 160, and detects the logic of the received output signal. The judging section 140 judges the output signal detected by the comparator 130. In one example, the judging section 140 judges the acceptability of the device under test 200 by referring to the logic of the output signal detected by the comparator 130. The DC test unit 150 supplies a predetermined DC voltage to the device under test 200 via the I/O terminal 160. For example, the testing apparatus 100 may use the DC test unit 150 to perform a voltage test through current application or a current test through voltage application.

The fifth semiconductor switch 20-5 is positioned between the first terminal 12 and the second terminal 14, which are respectively (i) at least one of the output end of the driver 120 and the input end of the comparator 130 and (ii) the input and output end of the device under test 200. The fifth semiconductor switch 20-5 electrically connects or disconnects the first and second terminals 12 and 14 to/from each other. According to the present embodiment, the fifth semiconductor switch 20-5 is positioned between the I/O terminal 160 and a connection point connecting together the output end of the driver 120 and the input end of the comparator 130. According to the present embodiment, the fifth semiconductor switch 20-5 is turned on when the testing apparatus 100 performs a logic test and turned off when the testing apparatus 100 does not perform a logic test. In other words, the fifth semiconductor switch 20-5 functions as an I/O relay that turns on/off the passage of the test signal and the output signal.

The sixth semiconductor switch 20-6 is positioned between the first terminal 12 and the second terminal 14, which are respectively (i) the output end of the DC test unit 150 and (ii) the input and output end of the device under test 200. The sixth semiconductor switch 20-6 electrically connects or disconnects the first and second terminals 12 and 14 to/from each other. According to the present embodiment, the sixth semiconductor switch 20-6 is positioned between the I/O terminal 160 and the output end of the DC test unit 150. According to the present embodiment, the sixth semiconductor switch 20-6 is turned on when the testing apparatus 100 performs a DC test and turned off when the testing apparatus 100 does not perform a DC test. In other words, the sixth semiconductor switch 20-6 functions as a DC relay that turns on/off the passage of the DC voltage.

Utilizing the fifth semiconductor switch 20-5, which exhibits a small RC product, as the I/O relay, the testing apparatus 100 with the above-described configuration only causes low distortion when transmitting high-frequency test signals and output signals and low loss when transmitting test signals and output signals whose frequency falls within a wide range from the DC to approximately several dozen GHz. In addition, since the fifth semiconductor switch 20-5 has a small number of impedance mismatching points, the testing apparatus 100 can accurately achieve a predetermined impedance (for example, 50Ω) for the transmission path between (i) the device under test 200 and (ii) the driver 120 and the comparator 130. Furthermore, since the fifth semiconductor switch 20-5 has a low DC on resistance, the testing apparatus 100 can reduce the loss and waveform distortion of the test signal and the output signal.

Utilizing the sixth semiconductor switch 20-6, which has a low electrostatic capacitance during the off state, as the DC relay, the testing apparatus 100 with the above-described configuration can reduce the influence made by the sixth semiconductor switch 20-6, during a logic test, on the impedance of the transmission path connecting the device under test 200 to the driver 120 and the comparator 130. In addition, since the sixth semiconductor switch 20-6 has a low DC on resistance, the testing apparatus 100 can reduce the difference in DC level between the output end of the DC test unit 150 and the input and output end of the device under test 200.

Since the fifth and sixth semiconductor switches 20-5 and 20-6 have a long lifetime, the testing apparatus 100 can obtain a long mean down time. Furthermore, since the fifth and sixth semiconductor switches 20-5 and 20-6 have a small size and a simple configuration, the testing apparatus 100 can reduce the device size and lower the manufacturing cost.

Although some aspects of the present invention have been described by way of exemplary embodiments, it should be understood that those skilled in the art might make many changes and substitutions without departing from the spirit and the scope of the present invention which is defined only by the appended claims.

The claims, specification and drawings describe the processes of an apparatus, a system, a program and a method by using the terms such as operations, procedures, steps and stages. When a reference is made to the execution order of the processes, wording such as "before" or "prior to" is not explicitly used. The processes may be performed in any order unless an output of a particular process is used by the following process. In the claims, specification and drawings, a flow of operations may be explained by using the terms such as "first" and "next" for the sake of convenience. This, however, does not necessarily indicate that the operations should be performed in the explained order.

What is claimed is:

1. A testing apparatus for testing a device under test, comprising:
    a test signal generating section that generates a test signal;
    a driver that supplies the test signal to the device under test;
    a comparator that detects an output signal from the device under test;
    a judging section that judges the output signal detected by the comparator; and
    a switching device that electrically connects or disconnects, to/from each other, a first terminal and a second terminal, which are respectively (i) at least one of an output end of the driver and an input end of the comparator and (ii) an input and output end of the device under test, wherein
    the switching device includes:
        a semiconductor layer;
        a drain electrode that is formed in the semiconductor layer, the drain electrode being connected to the first terminal;
        a source electrode that is formed in the semiconductor layer, the source electrode being connected to the second terminal;
        a gate insulator that is formed on the semiconductor layer between the drain electrode and the source electrode;
        a floating gate that is formed on the gate insulator, the floating gate retaining a charge therein; and
        a tunnel gate that is formed on the floating gate, the tunnel gate supplying a tunnel current determined by a driving voltage applied thereto to charge or discharge the floating gate.

2. The testing apparatus as set forth in claim 1, wherein the switching device further includes a driving section that connects or disconnects the drain electrode and the source electrode to/from each other by controlling the driving voltage to cause the tunnel gate to charge or discharge the floating gate.

3. The testing apparatus as set forth in claim 2, wherein an area of the tunnel gate on the floating gate is smaller than an area of the floating gate on the semiconductor layer.

4. The testing apparatus as set forth in claim 3, wherein
    the switching device includes a plurality of the tunnel gates that are formed on the floating gate in different regions, and
    the switching device further includes:
        a selecting section that selects at least one of the plurality of tunnel gates; and
        a supply section that supplies the driving voltage output from the driving section to the selected at least one tunnel gate.

5. The testing apparatus as set forth in claim 4, wherein
the switching device further includes a diagnosing section that diagnoses characteristics of the connection and the disconnection between the first terminal and the second terminal observed when each of the plurality of tunnel gates is selected, and the selecting section makes the selection in accordance with the diagnosis made by the diagnosing section.

6. The testing apparatus as set forth in claim 4, wherein
the switching device further includes a diagnosing section that diagnoses characteristics of the connection and the disconnection between the first terminal and the second terminal observed when a first tunnel gate is selected from among the plurality of tunnel gates, and when the characteristics of the connection and the disconnection observed when the first tunnel gate is selected are diagnosed by the diagnosing section to be defective, the selecting section selects a second tunnel gate from among the plurality of tunnel gates.

7. The testing apparatus as set forth in claim 1, wherein the switching device further includes an inter-channel insulating portion that is formed in the semiconductor layer, the inter-channel insulating portion insulating a region at least including the drain electrode, the source electrode and a channel positioned between the drain electrode and the source electrode, from a different region.

8. The testing apparatus as set forth in claim 7, wherein the inter-channel insulating portion is formed on an insulating layer formed on a semiconductor substrate.

9. The testing apparatus as set forth in claim 1, wherein
the switching device further includes:
a first transmission line and a second transmission line that are formed in one or more interconnection layers formed on the semiconductor layer, the first and second transmission lines transmitting a signal; and
an inter-layer insulator that insulates the interconnection layers from each other and insulates the interconnection layers from the semiconductor layer, the first terminal is connected to one end of the first transmission line, and the second terminal is connected to one end of the second transmission line.

10. The testing apparatus as set forth in claim 9, wherein the first and second transmission lines are microstrips.

* * * * *